United States Patent [19]

Proebsting et al.

[11] 4,061,954
[45] Dec. 6, 1977

[54] DYNAMIC RANDOM ACCESS MEMORY SYSTEM

[75] Inventors: Robert J. Proebsting, Richardson; Paul R. Schroeder, Dallas, both of Tex.

[73] Assignee: Mostek Corporation, Carrollton, Tex.

[21] Appl. No.: 741,720

[22] Filed: Nov. 8, 1976

Related U.S. Application Data

[62] Division of Ser. No. 644,857, Dec. 29, 1975.

[51] Int. Cl.$^2$ ............................................. G11C 11/24
[52] U.S. Cl. ..................................... 320/1; 307/289; 365/203; 365/202
[58] Field of Search .......... 320/1; 340/173 R, 173 FF, 340/172.5; 307/109, 289, 241

[56] References Cited

U.S. PATENT DOCUMENTS 3,940,678  2/1976  Koyama ................................... 320/1

Primary Examiner—Terrell W. Fears
Attorney, Agent, or Firm—Hubbard, Thurman, Turner & Tucker

[57] ABSTRACT

An integrated circuit MOSFET dynamic random access memory is disclosed which utilizes a plurality of memory cells arrayed in rows and columns. One-half of the cells in each column are connected to a true digit line and the other half are connected to a complement digit line. The true and complement digit lines are each connected through a separate transistor, which functions as a variable resistance, to true and complement input nodes of a sense amplifier. The sense amplifier is comprised of a transistor connecting each input node to a latch node, with the gates of the transistors cross coupled to the opposite input nodes. The digit lines are precharged to equal voltages corresponding to $V_{DD}$. When enabled by an address signal, a storage cell is connected to one of the digit lines at the same time a dummy cell is connected to the other digit line. As a result, one of the digit lines has a slightly higher voltage than the other. The first set of transistors permit the latching node to be very rapidly brought to ground in order to completely discharge the digit line having the lower voltage, while maintaining substantially the initial high voltage on the other digit line. The common gate nodes of the first transistors are precharged to the drain supply voltage when one of the true or complement digit lines in each column is low and then isolated to provide bootstrapping above $V_{DD}$ when the digit lines are subsequently precharged to the drain supply voltage of the system. The split digit lines are precharged from a common node through a first pair of transistors, with the common node being charged through a third transistor. The third transistor is turned off before the first pair of transistors to prevent noise in the drain supply voltage from resulting in uneven voltage precharges on the split data lines.

1 Claim, 3 Drawing Figures

DYNAMIC RANDOM ACCESS MEMORY SYSTEM

This is a division of application Ser. No. 644,857, filed Dec. 29, 1975.

This invention relates generally to dynamic random access memories formed on MOSFET type large scale integrated circuits, and more particularly relates to a system having dynamic balanced sense amplifiers and both read and write capability.

It is presently known in the industry how to fabricate dynamic random access read/write memories using MOSFET integrated circuit technology. These circuits typically utilize 4,096 or 16,384 storage cells each comprised of a capacitive storage node and a single transistor connecting the node to a column or digit line. For a 4096 bit system, the storage cells are typically arranged in an array of sixty-four rows and sixty-four columns. Data is stored in the cell by charging the digit line to either ground potential or a voltage somewhat less than the drain supply voltage, while momentarily turning the transistor on by bringing a row enable line high to store the voltage of the digit line on the storage node. A logic "0" is stored when the voltage on the node is less than some selected voltage between the drain supply voltage, typically +12 volts, and the source supply voltage or ground, and a logic "1" when the stored voltage is greater than the selected voltage. A typical value for the arbitrary voltage level is about five volts. Data is read from a storage cell by firt precharging the digit bus to some voltage, and then after termination of the precharge, turning the transistor connecting the cell to the digit bus on. If a logic "0" is stored on the node, the voltage of the column bus is decreased by a greater amount or increased by a lesser amount than when a logic "1" is stored. These two ultimate levels of voltage on the digit bus are then discriminated by a sense amplifier to read the logic "1" or logic "0" from the cell.

One method for discriminating between the different voltage changes on the digit line is described in co-pending application Ser. No. 513,091, filed Oct. 8, 1974, entitled "Dynamic Random Access Memory MISFET Integrated Circuit", and assigned to the assignee of the present invention. This method samples the voltage on the digit line before the cell is addressed and compares this sampled voltage with the voltage on the digit line after the cell is addressed. This system has proven successful and has been commercially employed. Another approach to the problem is typified by U.S. Pat. Nos. 3,588,844, and 3,514,765, issued to Christensen. In this system, the digit line is divided into equal parts and connected to a balanced amplifier. This type of system has been employed by various workers in the art with varying degrees of success. However, various embodiments of this type system have heretofore alternatively consumed D.C. power, or has required an unreasonable period of time for precharge, or has alternatively required an unreasonable period of time to read data, or has resulted in an unacceptably low level voltage on the digit bus which should remain high, or has required additional means to restore the digit bus to an appropriately high level, or has alternatively required a larger signal and, hence, a larger storage cell for proper sensing.

The present invention is concerned with an improved memory system having the advantages of split digit lines connected to a balanced amplifier, and yet which has improved speed as a result of both a short precharge period and a short read time. In addition, the system consumes no D.C. power and is capable of high sensitivity detection. In accordance with the invention, true and complement digit lines are connected through resistances to input nodes of an amplifier comprised of cross coupled transistors connecting each of the input nodes to a latching node. In the preferred form, the input resistors are transistors the gates of which are common. The digit lines are precharged to the drain supply voltage, while the gates of the input transistors are bootstrapped to a voltage above the drain supply voltage to permit the differential voltage of the digit lines to be transferred to the input nodes of the sense amplifiers. The latching node is then transitioned to ground at a progressively greater rate to allow discharge of one of the digit lines while substantially maintaining the drain supply voltage on the other digit line. The resistance provided by the transistors is greatest as the voltage on the latching node is started down so that the input node of the amplifier which starts out at the lower voltage level can be quickly discharged without first having to discharge the relatively large capacitance to the digit line to which it is attached. As a result, the cross coupled transistors are more quickly latched to prevent any significant discharge of the other digit line which had the higher initial voltage level. Yet as the voltage on the input node being discharged decreases, the resistance of the transistor progressively decreases to quickly discharge the digit line which had the initial lower voltage.

A unique method of charging the digit lines is also provided to substantially eliminate adverse effects from noise in the voltage supply, and a unique system for controlling the voltage on the gates of the resistive transistors is also provided.

The novel features believed characteristic of this invention are set forth in the appended claims. The invention itself, however, as well as other objects and advantages thereof, may best be understood by reference to the following detailed description of an illustrative embodiment, when read in conjunction with the accompanying drawings, wherein:

Figure 1:
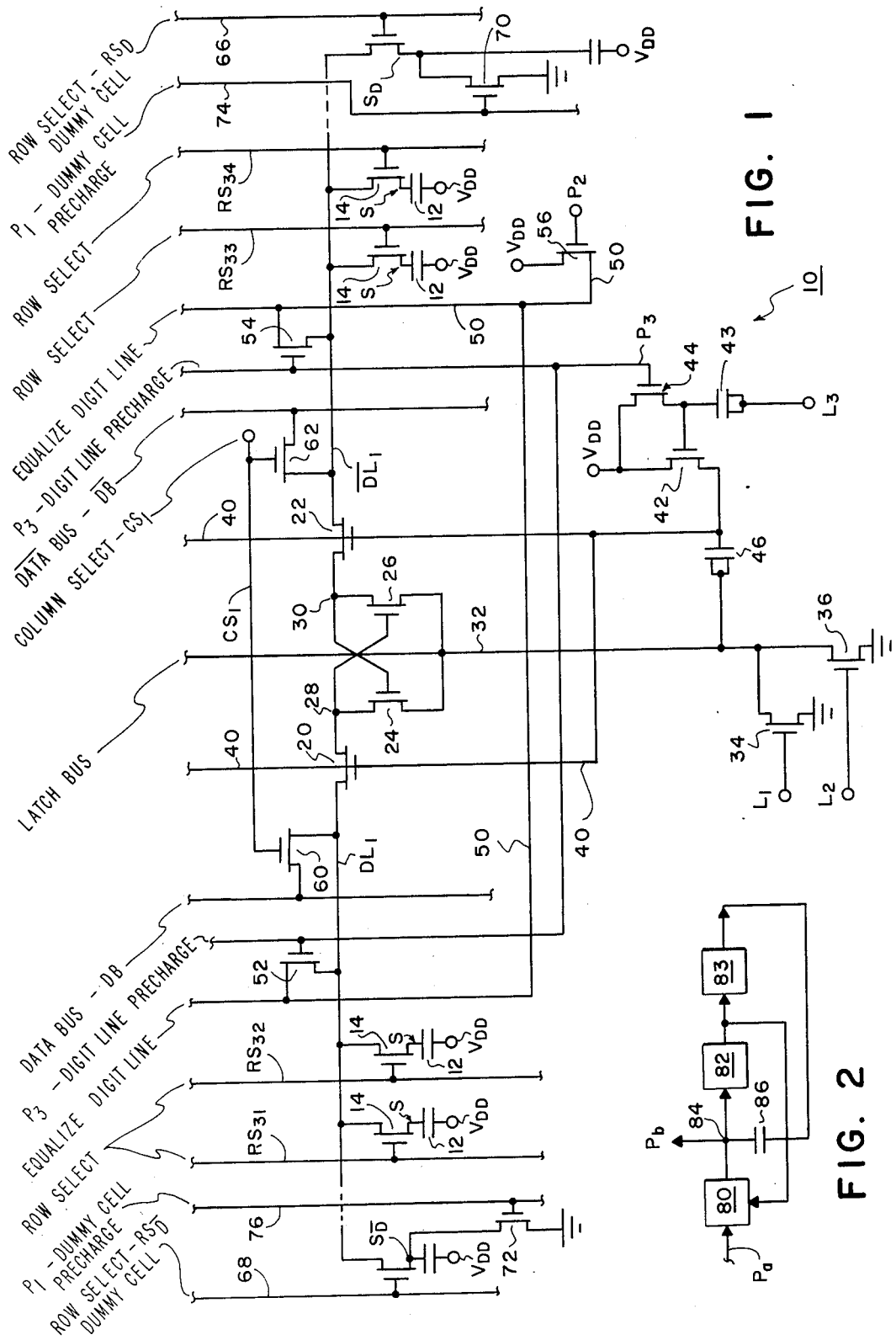
FIG. 1 is a schematic circuit diagram of a dynamic random access memory system in accordance with the present invention.

Referring now to the drawings, a portion of a dynamic random access memory in accordance with the present invention is indicated generally by the reference numeral 10 in FIG. 1. The system 10 may typically include 4,096 or 16,384 binary storage cells formed on a single integrated circuit which also includes the appropriate control circuitry. The control circuit not herein disclosed in detail may be any prior art circuitry such as the described co-pending U.S. Application Ser. No. 513,091, entitled "Dynamic Random Access Memory MISFET Integrated Circuit", filed by Robert J. Proebsting, et al and assigned to the assignee of the present invention, which application is hereby incorporated by reference. Four of the storage cells are indicated by the reference character S in FIG. 1. Each storage cell is comprised of a capacitive storage node 12 and a field effect transistor 14 which are connected in series between a digit line $DL_1$ or $\overline{DL}_1$ and $V_{DD}$ i.e. the drain supply voltage.

Storage cells S are arrayed in equal numbers of rows and columns, typically 64, for a 4,096 bit system, and 128 for a 16,384 bit system. For ease of discussion only the first column of storage cells will be discussed, although it will be understood that another 63 columns of identical configurations would be provided in a typical system. Half of the 64 storage cells S arrayed in each column are connected to a true digit line $DL_1$ and the other half are connected to a complement digit line $\overline{DL}_1$ as illustrated in FIG. 1. Each of the digit lines $DL_1$ and $\overline{DL}_1$ are the same geometric configuration and are connected to the same number of storage cells S. In addition, a dummy cell $\overline{SD}$ is connected to digit line $DL_1$ and another dummy cell SD is connected to digit line $\overline{DL}_1$ to establish a reference voltage on one of the digit lines as will presently be described. The gates of all of the storage cells S in a common row are connected to a row select line RS. Row select lines $RS_{31} - RS_{34}$ are illustrated in FIG. 1. Of course, it will be understood that row select lines $RS_1 - RS_{30}$ and $RS_{35} - RS_{64}$ have been omitted in order to simplify the illustrations.

The true digit line $DL_1$ is connected to the true input node 28 of a latching differential amplifier by the channel of a first transistor 20 and complement digit line $\overline{DL}_1$ is connected to the complement input node 30 of the differential amplifier by the channel of a second transistor 22. The latching differential amplifier includes third and fourth transistors 24 and 26 which connect input nodes 28 and 30 to a latch bus 32. The gate of the third transistor 24 is cross coupled to the complement input node 30 and the gate of the fourth transistor 26 is cross coupled to the true input node 28. The latch bus 32 is pulled toward ground at a relatively slow rate when transistor 34 is turned on by clock signal $L_1$, and at a much faster rate when transistor 36 is turned on by clock signal $L_2$ because transistor 36 is substantially larger than transistor 34. Clock $L_1$ goes high slightly before $L_2$ for purposes which will presently be described in connection with FIG. 3.

The gates of all transistors 20 and 22 for the 64 column lines are connected to a common node 40 which may be precharged to $V_{DD}$ through transistor 42. The gate of transistor 42 is connected to $V_{DD}$ through transistor 44, the gate of which is controlled by precharge signal $P_3$. The gate of transistor 42 is capacitively boosted above $V_{DD}$ by capacitor 43 connected to clock pulse $L_3$ which occurs after transistor 44 has been turned off by precharge clock $P_3$ as will presently be described. Node 40 is capacitively coupled to latch bus 32 by capacitor 46 to assist the stray capacitance of transistors 20 and 22 in driving node 40 above $V_{DD}$ as will presently be described.

The true and complement digit lines DL and $\overline{DL}$ of all 64 columns are precharged from node 50 through transistors 52 and 54, the gates of which are controlled by the common precharge signal $P_3$. Node 50 is driven to $V_{DD}$ through a transistor 56, the gate of which is controlled by precharge signal $P_2$ which goes above $V_{DD}$. Data may be written in an addressed cell, or read from an addressed cell by true and complement data buses DB and $\overline{DB}$ and column select transistors 60 and 62, respectively, the gates of which are controlled by a column select line $CS_1$.

Dummy cells SD and $\overline{SD}$ each have a capacitance approximately one-half the capacitance of a data storage cell S. All dummy cells SD are enabled by line 66 whenever any one of the row select lines $RS_1 - RS_{32}$ associated with digit line $DL_1$ is active. Similarly, dummy cell $\overline{SD}$ is enabled by circuit line 68 whenever any row select line associated with digit line $\overline{DL}_1$ is active. The storage node of dummy cell SD is precharged to ground potential through transistor 70, and the storage node of dummy cell $\overline{SD}$ is precharged to ground potential through transistor 72 when precharge signal $P_1$ applied to lines 74 and 76 is high as will presently be described.

Precharge clock signals $P_2$ and $P_3$ both require voltages above the drain supply voltage $V_{DD}$ for satisfactory operation of the circuit as will hereafter be described in greater detail. The supply voltage $V_{DD}$ is usually the maximum externally generated supply voltage available in the circuits and in the commercial embodiment of the present invention is +12 volts, since N-channel silicon gate process techology is employed. It is desired for $P_2$ and $P_3$ to have high levels of approximately +16 volts. A suitable system for producing a clock voltage greater than the drain supply voltage $V_{DD}$ is illustrated schematically in FIG. 2. This system is described in detail and claimed in co-pending U.S. application Ser. No. 513,091, now U.S. Pat. No. 3,969,706, entitled "Clock Generator and Delay Stage," filed on the same day as the present invention by Paul R. Schroeder and Robert J. Proebsting, and assigned to the assignee of the present invention. This system utilizes a plurality of delay stages 80, 82 and 83. The output from delay stage 80 is applied to the input of a delay stage 82, the output of which is applied to a third delay stage 83. The output of delay stage 82 is fed back to delay stage 80 to isolate the output node 84 from stage 80. The output of stage 83 is capacitively coupled to node 84 by capacitor 86. Thus as a result of a precharge timing signal $P_4$ to delay stage 80, node 84 is first driven substantially to $V_{DD}$ after one delay period. A short time later, the output of delay stage 82 turns the output of delay stage 80 off, thus isolating the voltage on node 84. Then when the output of delay stage 83 subsequently goes to $V_{DD}$ node 84 is capacitively boosted above $V_{DD}$. This circuitry easily provides an output of 16 volts from a supply voltage $V_{DD}$ of 12 volts. Other suitable systems may be employed to produce the precharge clock signals $P_2$ and $P_3$ above $V_{DD}$.

Figure 3:
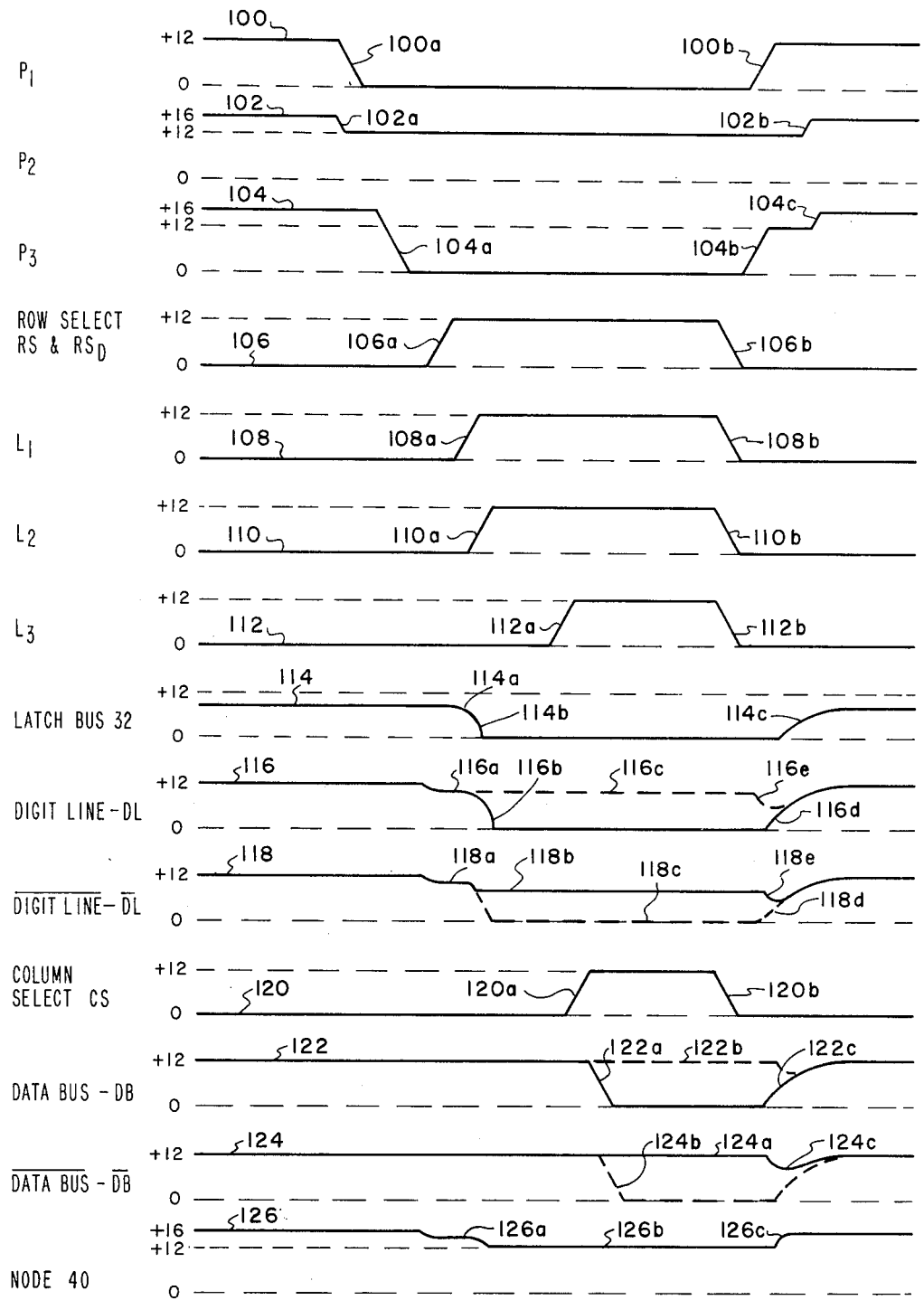
FIG. 3 is a timing diagram which serves to illustrate the operation of the circuit of FIG. 1.

The operation of the circuit of FIG. 1 may best be understood by referring to the timing diagram of FIG. 3. FIG. 3 illustrates the voltage with respect to time of precharge signals $P_1$, $P_2$ and $P_3$ by means of time lines 100, 102 and 104, respectively. The voltage on the one active row select line $RS_1$ through $RS_{64}$ and also the appropriate dummy cell enable line $RS_D$ or $RS_{\overline{D}}$ is indicated by time line 106. All other row select lines $RS_1$ through $RS_{64}$ and the other dummy cell enable line remain at ground potential. Latch clock signals $L_1$, $L_2$, and $L_3$ are indicated by time lines 108, 110, and 112, respectively. The voltage resulting on latch bus 32 is represented by time line 114, and the voltages resulting on the true and complement digit lines DL and $\overline{DL}$ are represented by time lines 116 and 118 respectively. The voltage on the addressed column select line CS is represented by time line 120, and the resulting voltages on the true data bus DB and the complement data bus $\overline{DB}$ are represented by time lines 122 and 124, respectively.

During the precharge period, i.e., the period between active cycles, precharge signal $P_1$ is at $V_{DD}$, i.e., +12 volts, and precharge signals $P_2$ and $P_3$ are above $V_{DD}$ at +16 volts. As a result of $P_1$ being high, transistors 70 and 72 are turned on to discharge the nodes of dummy cells SD and $\overline{SD}$ to ground or 0 volts. $P_2$ is at +16 volts so that transistor 56 is turned on and node 50 is charged fully to $V_{DD}$. The digit line precharge $P_3$ is at +16 volts s that data lines DL and $\overline{DL}$ are all charged to +12 volts as indicated by lines 116 and 118 in FIG. 3.

As will hereafter be more evident, node 40, which is represented by time line 126 in FIG. 3, is at +16 volts as a result of capacitive coupling through the gates of transistors 20 and 22 of all sixty-four columns and also capacitor 46. In this regard, it will be appreciated that transistor 42 is non-conductive even though node 40 has been bootstrapped above $V_{DD}$ because its gate and effective source node in this condition are both at $V_{DD}$. Since $V_{DD}$ is applied to the gates of both transistors 24 and 26, the latch bus 32 will be precharged to $V_{DD}$ less one threshold, or about +10 volts.

At the start of an active cycle, precharge clock $P_1$ goes from +12 volts to ground, as represented by event 100a, so as to turn transistors 70 and 72 off, and precharge signal $P_2$ falls from +16 to +12 volts, as represented by event 102a, so that transistor 56 is effectively turned off since node 50 is also at $V_{DD}$. At this stage, it will be noted that precharge signal $P_3$ is still at +16 volts for a short time after transistor 56 is turned off to permit the voltages on data line $DL_1$ and $\overline{DL}_1$ to precisely equalize through transistors 52 and 54, even though noise in the voltage supply $V_{DD}$ together with unequal capacitive values of the digit lines or unequal conductances of transistors 52 and 54 may have otherwise resulted in unequal voltages on digit lines $DL_1$ and $\overline{DL}_1$, at the instant transistor 56 turned off. Then precharge signal $P_3$ goes to ground, trapping the precisely equal precharge voltages on digit lines $DL_1$ and $\overline{DL}_1$ at a level substantially equal $V_{DD}$, as represented by event 104a. After precharge $P_3$ is at ground, the one row select line identified by the row address signals applied to the chip goes from 0 volts to +12 volts as represented by event 106a. At the same time, the appropriate dummy cell is also addressed. For example, assume row select line $RS_{31}$ is active. In that event, storage cell SD would be enabled by line 66 going from 0 to +12 volts. If a logic "0" is stored in the addressed cell, the voltage on digit line $DL_1$ would drop to a greater extent than the voltage on digit line $\overline{DL}_1$ because of the fact that the capacitance 12 of the storage cell is approximately twice the capacitance of the dummy cell. Since the node 40 is at +16 volts this change in the voltage on data lines $DL_1$ and $\overline{DL}_1$ is freely transferred to input nodes 28 and 30 of the differential amplifier. However, the latch bus 32 is still one threshold below the precharge voltage of data line $DL_1$ and $\overline{DL}_1$ so that conductance does not yet occur through either transistor 24 or 26. Next latch signal $L_1$ goes from 0 to +12 volts, thus beginning to slowly discharge the latch bus 32 as represented by event 114a. As the voltage of latch bus 32 begins to fall, transistor 24 begins to conduct before transistor 26 because node 30 has a slightly higher voltage than node 28. As transistor 24 conducts, node 28 is progressively lowered almost as fast as node 32 so that transistor 26 remains essentially off, thus keeping node 30 high and progressivey increasing the gate-to-source bias on transistor 24. This condition is greatly assisted by the fact that initially transistor 20 has a low gate voltage with respect to its source voltage and thus provides considerable resistance between node 28 and digit line $DL_1$. Since node 28 has a relatively small capacitance compared to that of digit line $DL_1$, node 28 can be quickly discharged by relatively small currents through transistor 24. After a very short period of time, the differential voltage between nodes 28 and 30 increases substantially and latch signal $L_2$ goes high as represented by event 110a which causes latch bus 32 to discharge at a much greater rate as represented by event 114b in FIG. 3. As latch node 32 transitions to ground, both transistors 24 and 20 become increasingly more conductive so that digit line $DL_1$ is very rapidly discharged to ground as represented by event 116b. However, digit line $\overline{DL}_1$ remains near $V_{DD}$, typically +11 volts, as represented by event 118b.

Because of the capacitive coupling between node 40 and the digit lines $DL_1$ and $\overline{DL}_1$ provided by the stray capacitance of all the transistors 20 and 22 of all columns as well as the capacitor 46 between node 40 and latch bus node 32, node 40 is also pulled down to approximately +12 volts as digit line $DL_1$ is pulled to ground as represented by event 126a.

If a logic 1 had been stored in the addressed storage cell S, on the other hand, as defined by a voltage in the cell greater than +5.0 volts, then data line $DL_1$ would have a voltage greater than data line $\overline{DL}_1$ after the row select signal 106a. This would result in digit line $DL_1$ remaining high as represented by dotted line 116c and digit line $\overline{DL}_1$ would go low as represented by 118c in FIG. 3 when the voltage on the latch bus transitioned low in response to events 108a and 110a of latch signals $L_1$ and $L_2$. It is for this case, i.e., proper sensing of a high stored voltage that the dummy cell is required. Without it, there would be nothing to provide the negative voltage transition on digit line $\overline{DL}_1$ and thus provide the differential voltage necessary for proper sensing.

When the column select line CS goes from 0 to +12 volts as indicated by event 120a, true data bus DB goes from a precharge level of +12 volts to 0 volts as represented by event 122a, assuming that a logic "0" was stored in the addressed cell attached to data line $DL_1$, and complement data bus $\overline{DB}$ remains at +12 volts as represented by segment 124a. On the other hand, if a logic "1" had been stored in the addressed storage cell attached to the true data line $DL_1$, then the true data bus DB would remain high as represented by dotted line 122b and the complement data bus $\overline{DB}$ would go to ground as represented by event 124b.

As previously mentioned, the gate of transistor 42 was precharged to $V_{DD}$ during the precharge period while signal $P_3$ was at +16 volts. During the cycle, $P_3$ transitioned to 0 volts, thus turning transistor 44 off and trapping approximately +12 volts on the gate of transistor 42. After node 40 has been discharged to about +12 volts as a result of data lines $DL_1$ or $\overline{DL}_1$ and node 40 going to ground, latch signal $L_3$ goes from 0 to +12 volts as indicated by event 112a in FIG. 3. This signal is coupled through capacitor 43 to the gate of transistor 42, thus driving the gate substantially above $V_{DD}$ to ensure that node 40 is established at +12 volts as represented at event 126b. In normal operation, this merely overcomes leakage from node 40, but during start up provides the initial +12 volt charge before capacitive boosting occurs as will now be described.

At the end of a cycle, row select line 106 goes to ground at event 106b and column select goes to ground at event 120b so that transistors of the addressed storage cell and the addressed dummy cell are turned off and so that column address transistors 60 and 62 are turned off. Latch signal $L_3$ also goes to ground as represented by event 112b, pulling the gate node of transistor 42 back to approximately $V_{DD}$ so that node 40 can be capacitively boosted above $V_{DD}$. Latch signals $L_1$ and $L_2$ also go to ground as represented by events 108b and 110b.

Figure 2:
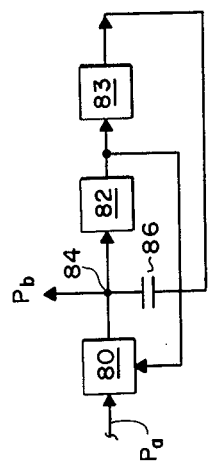
FIG. 2 is a schematic diagram illustrating a typical subcomponent used to operate a portion of the circuit of FIG. 1.

Precharge signals $P_1$ and $P_3$ then go to +12 volts as represented by events 100b and 104b, and precharge signal $P_3$ goes to +16 volts at event 104c, which is approximately two delay stages later than event 104b as a result of the operation of a circuit such as illustrated in FIG. 2. Precharge signal $P_2$ may conveniently transition from +12 volts to +16 volts at the same time as represented by event 102b.

As precharge signal $P_3$ goes positive at event 104b, transistors 52 and 54 turn on so that the digit line $DL_1$ or $\overline{DL}_1$ which has been discharged to ground begins to charge positively as represented by either the solid line 116d or by the dotted line 118d in FIG. 3. This charging continues during the precharge period as precharge signal $P_3$ goes to +16 volts at event 104c and is facilitated by the fact that precharge signal $P_2$ also goes to +16 volts so that node 50 is rapidly charged all the way to $V_{DD}$ of +12 volts. From lines 116 and 118 of FIG. 3, it will be noted that the digit line $DL_1$ or $\overline{DL}_1$ which remained near $V_{DD}$ is initially partially discharged when transistors 52 and 54 are turned on, as represented by events 116e and 118e.

The latch bus 32 is precharged through transistors 20 and 24, and through transistors 22 and 26 of all of the columns to a voltage level one threshold below $V_{DD}$ as represented by event 114c.

Node 40, which is now isolated because transistor 42 was turned off when latch signal $L_3$ went to ground at event 112b, is capacitively boosted back to about +16 volts, as represented by event 126c, because of the stray capacitance of transistors 20 and 22 of all columns and of capacitor 46 which is added to enhance this boosting. It will be appreciated that either the true or complement data line $DL_1$ or $\overline{DL}_1$ of every column is discharged during each row address cycle so that the combined stray capacitance of 64 transistors contributes to boosting node 40 above $V_{DD}$ as the 64 digit lines are recharged from ground to +12 volts. As a result, node 40 is normally capacitively boosted to about +16 volts during the precharge cycle.

The data buses DB and $\overline{DB}$ are similarly precharged to +12 volts as represented by events 122c and 124c by circuitry which is not illustrated. In the preferred embodiment of the present system, precharge circuitry similar in function to that used to precharge the data lines $DL_1$ and $\overline{DL}_1$ is also used to precharge the true and complement data buses DB and $\overline{DB}$ and this fact causes the recharge events 122c and 124c to have similar characteristics to the lines illustrating the recharge lines $DL_1$ and $\overline{DL}_1$.

It should be noted that since the digit line $DL_1$ and $\overline{DL}_1$ start at $V_{DD}$ rather than $V_{DD}$ less one threshold, and since the resistive means minimizes the conduction through one of the cross coupled transistors, the digit line that started at the higher initial voltage normally finishes with a voltage above $V_{DD}$ less one threshold. After completion of a cycle, a cell that started with a voltage just above the minimum level for a logic "1" finishes with a voltage $V_{DD}$ less one threshold. Conversely, a cell that started with a voltage level just below the maximum level for a logic "0" finishes with a voltage of ground. Thus the act of reading a cell followed by pulling the latch signal to ground refreshes poor logic levels stored in the cell to the optimum logic levels.

From the above detailed description of a preferred embodiment of the present invention, it will be appreciated that an improved latching differential amplifier has been described which will have many applications in MOSFET technology and perhaps in other technologies.

Although preferred emboidments of the invention have been described in detail, it is to be understood that various changes, substitutions and alterations can be made therein without departing from the spirit of the invention as defined by the appended claims.

What is claimed is:

1. The method for producing binary logic levels on true and complement output nodes having relatively large capacitance values which comprises:
    establishing a voltage level on both the true and complement output nodes near the higher logic level, the difference in voltage levels on the output nodes representing an input signal, and transferring the voltage levels through first and second impedances to true and complement input nodes, respectively, having relatively small capacitance values;
    then discharging the true input node through a first transistor the conductance of which is controlled by the voltage on the complement input node and the true output node through the first impedance to the true input node, or in the alternative discharging the complement input node through a second transistor the conductance of which is controlled by the voltage on the true input node and the complement output node through the second impedance to the complement input node, the node being discharged being that node that had the lower initial voltage value.

* * * * *

UNITED STATES PATENT AND TRADEMARK OFFICE
CERTIFICATE OF CORRECTION

PATENT NO. : 4,061,954
DATED : December 6, 1977
INVENTOR(S) : Robert J. Proebsting and Paul R. Schroeder It is certified that error appears in the above-identified patent and that said Letters Patent are hereby corrected as shown below:

Column 1, Line 30, "firt" should be --- first ---.

Column 1, in Line 40, delete "on the digit line is described in co-"; delete all of Line 41, Line 42 and Line 43; in Line 44, delete "present invention. This method", and substitute --- on the digit line is described in U. S. Patent No. 3,969,706. This method ---.

Column 2, Line 57, delete "may be any prior art circuitry such as", delete Lines 58-62, and substitute --- may be any prior art circuitry such as that described in U. S. Patent No. 3,969,706, the terms of which are hereby incorporated by ---.

Column 4, Line 16, "techology" should be --- technology ---.

Column 4, Line 22, "513,091" should be --- 644,855 ---.

Column 4, Line 22, "3,969,706" should be --- 4,061,933 ---.

Column 4, Line 23, delete "the same day as" and substitute --- December 29, 1975 ---.

Column 4, Line 24, delete "the present invention".

Column 4, Line 68, the second "SD" should be --- $\overline{SD}$ ---

Column 5, Line 3, "s" should be --- so ---.

Column 5, Line 3, delete "data" and substitute --- digit ---.

Column 5, Line 24, delete "data" and substitute --- digit ---.

Column 5, Line 46, delete "data" and substitute --- digit ---.

UNITED STATES PATENT OFFICE
CERTIFICATE OF CORRECTION

PATENT NO. : 4,061,954            Page 2 of 2
DATED : December 6, 1977
INVENTOR(S) : Robert J. Proebsting and Paul R. Schroeder It is certified that error appears in the above-identified patent and that said Letters Patent are hereby corrected as shown below:

Column 5, Line 50, delete "data" and substitute --- digit ---.

Column 5, Line 60, "progressivey" should be --- progressively ---.

Column 6, Line 20, delete "data" and substitute --- digit ---.

Column 6, Line 21, delete "data" and substitute --- digit ---.

Column 6, Line 36, delete "data" and substitute --- digit ---.

Column 6, Line 40, delete "data" and substitute --- digit ---.

Column 6, Line 50, delete "data" and substitute --- digit ---.

Column 7, Line 37, delete "data" and substitute --- digit ---.

Column 7, Line 48, delete "data" and substitute --- digit ---.

Column 8, Line 1, after "recharge" insert --- of ---.

Column 8, Line 24, "emboidments" should be --- embodiments ---.

Signed and Sealed this

Twenty-first Day of November 1978

[SEAL]

Attest:

RUTH C. MASON
Attesting Officer

DONALD W. BANNER
Commissioner of Patents and Trademarks